United States Patent
Van Buskirk et al.

(10) Patent No.: US 6,744,668 B1
(45) Date of Patent: Jun. 1, 2004

(54) FLASH MEMORY ARRAY WITH DUAL FUNCTION CONTROL LINES AND ASYMMETRICAL SOURCE AND DRAIN JUNCTIONS

(75) Inventors: Michael A. Van Buskirk, Saratoga, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 10/233,906

(22) Filed: Sep. 3, 2002

Related U.S. Application Data

(62) Division of application No. 09/008,162, filed on Jan. 16, 1998, now Pat. No. 6,492,675.

(51) Int. Cl.[7] .............................................. G11C 16/04
(52) U.S. Cl. ........................... 365/185.18; 365/185.28; 365/185.33
(58) Field of Search ...................... 365/185.17, 185.18, 365/185.24, 185.28, 185.33; 257/314, 316

(56) References Cited

U.S. PATENT DOCUMENTS

| | | |
|---|---|---|
| 5,132,935 A | 7/1992 | Ashmore, Jr. |
| 5,191,556 A | 3/1993 | Radjy |
| 5,202,576 A | 4/1993 | Liu et al. |
| 5,235,544 A | 8/1993 | Caywood |
| 5,273,923 A | 12/1993 | Chang et al. |
| 5,293,212 A | 3/1994 | Yamamoto et al. |
| 5,306,658 A | 4/1994 | Gill |
| 5,349,220 A * | 9/1994 | Hong ..................... 365/185.27 |
| 5,474,947 A | 12/1995 | Chang et al. |
| 5,477,499 A | 12/1995 | Van Buskirk et al. |
| 5,481,493 A | 1/1996 | Bergemont |
| 5,506,431 A | 4/1996 | Thomas |
| 5,541,875 A | 7/1996 | Liu et al. |
| 5,596,531 A | 1/1997 | Liu et al. |
| 5,837,584 A | 11/1998 | Lu et al. |
| 5,943,262 A * | 8/1999 | Choi ..................... 365/185.17 |
| 6,001,689 A * | 12/1999 | Van Buskirk et al. ...... 438/266 |
| 6,266,281 B1 * | 7/2001 | Derhacobian et al. . 365/185.29 |
| 6,330,190 B1 * | 12/2001 | Wang et al. ........... 365/185.28 |
| 6,347,054 B1 * | 2/2002 | Wang et al. ........... 365/185.29 |
| 6,366,499 B1 * | 4/2002 | Wang et al. ........... 365/185.28 |
| 6,492,675 B1 * | 12/2002 | Van Buskirk et al. ...... 257/314 |

FOREIGN PATENT DOCUMENTS

| | | |
|---|---|---|
| JP | 3105971 | 5/1991 |

OTHER PUBLICATIONS

U.S. patent application Ser. No. 09/008,162, Van Buskirk, et al., filed Jan. 16, 1998.

Bellezza et al., "A New Self–Aligned Field Oxide Cell for Multimegabit EPROMs," International Electron Devices Meeting 1989, Technical Digest (Cat. No. 89CH2637–7), pp. 579–582, 1989.

(List continued on next page.)

Primary Examiner—Gene Auduong
(74) Attorney, Agent, or Firm—Fliesler Meyer LLP.

(57) ABSTRACT

A flash memory formed by a process wherein at least two parallel stacked gate strips are formed on a silicon substrate such that the stacked gate strips are separated by field oxide islands. Asymmetrical first and second junctions are formed in each of a set of source/drain regions and a chemical etch is applied to form the field oxide islands into oxide spacers that align a dual-function control line to the first and second junctions. The resulting flash memory includes a plurality of stacked gate islands, one or more source/drain regions between at least a subset of the plurality of stacked gate islands, first junctions in each of the source/drain regions, second junctions in each of the source/drain regions and dual function control lines in the source/drain regions.

15 Claims, 12 Drawing Sheets

OTHER PUBLICATIONS

Ming–Bing Chang, Umesh Sharma and Shih K. Cheng "An Improved Model For The Erase Operation Of A Flotox EEPROM Celi," Solid–State Electronics, vol. 35, No. 10, Pergamon Press Ltd., 1992, pp. 1513–1520.

Sameer Haddad, Chi Chang, Balaji Swaminathan and Jih Lien "Degradations Due To Hole Trapping In Flash Memory Cells" IEEE Electron Device Lett., vol. 10, No. 3, Mar. 1989, pp. 117–119.

Kanamori et al., "A New Source–Side Injection EPROM (SIEPROM) Cell for 3–V Only Flash Memory," The $14^{th}$ Annual IEEE Nonvolatile Semiconductor Memory Workshop, Aug. 13–16, 1995.

Kobayashi et. al., Memory Array Architecture and Decoding Scheme for 3V Only Sector Erasable DINOR Flash Memory, IEEE Journal of Solid–State Circuits, V29, N 4, Apr. 1994.

Ohi et al. "An Asymmetrical Offset Source/Drain Structure for Virtual Ground Array Flash Memory with DINOR Operation," Proceedings of IEEE VLSI Technology Symposium 1993, pp. 57–58, 1993.

Onoda et al., "A Novel Cell Structure Suitable For A 3 volt Operation, Sector Erase Flash Memory," International Electron Devices Meeting 1992, pp. 599–602, Dec. 13–16, 1992.

Gheorghe Samachisa, Chien–Sheng Su, Yu–Sheng Kao, George Smarandoiu, Cheng–Yuan Michael Wang, Ting Wong and Chenming Hu "A 128K Flash EEPROM Using Double–Polysilicon Technology," IEEE Journal of Solid-State Circuits, vol. SC–22, No. 5, Oct. 1987.

Adel S. Sedra and Kenneth C. Smith "Microelectronic Circuits," $3^{rd}$ Ed, Harcourt Brace College Publishers, Orlando, Florida, 1991, pp. 966–970.

Yamauchi et al. "A New Cell Structure for Sub–Quarter Micron High Density Flash Memory," International Electron Devices Meeting 1995, Technical Digest (Cat. No. 95CH35810), pp. 267–270, 1995.

Yamauchi et al., "A Novel FN–NOR Virtual–ground Array Architecture for High Density Flash." The $15^{th}$ Annual IEEE Non–Volatile Semiconductor Memory Workshop, Feb. 9–12, 1997.

Yoshikawa et al., "An Asymmetrical Lightly Doped Source Cell for Virtual Ground High–Density EPROMS," IEEE Transactions On Electron Devices, V37, N4, pp. 1046–1051, 1990.

* cited by examiner

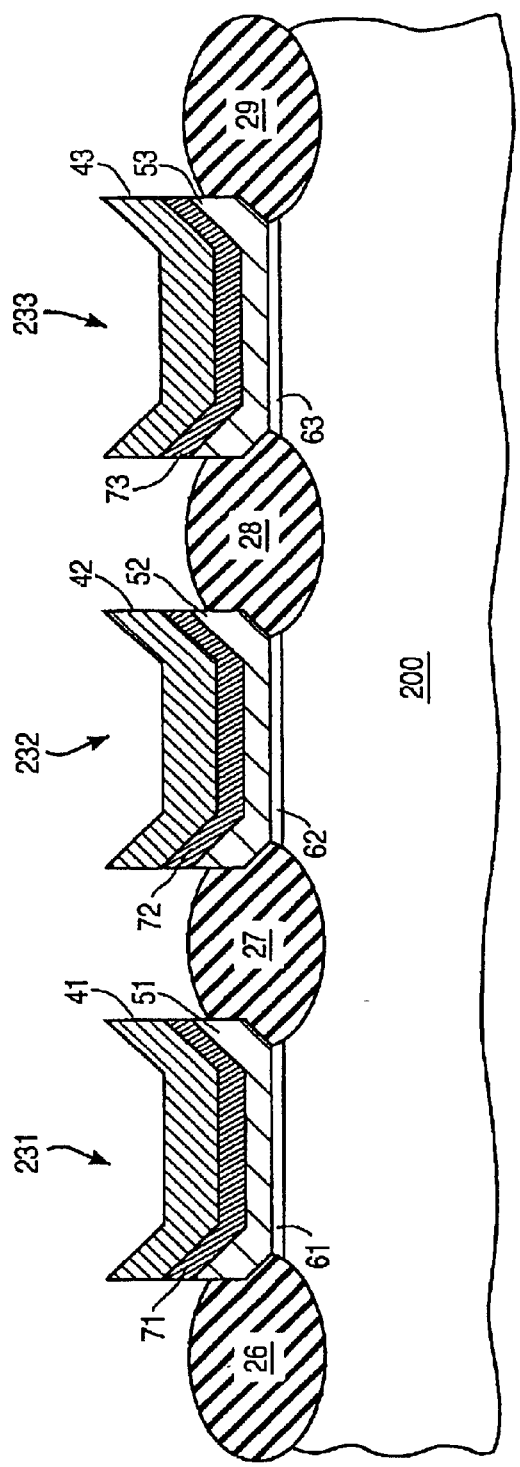
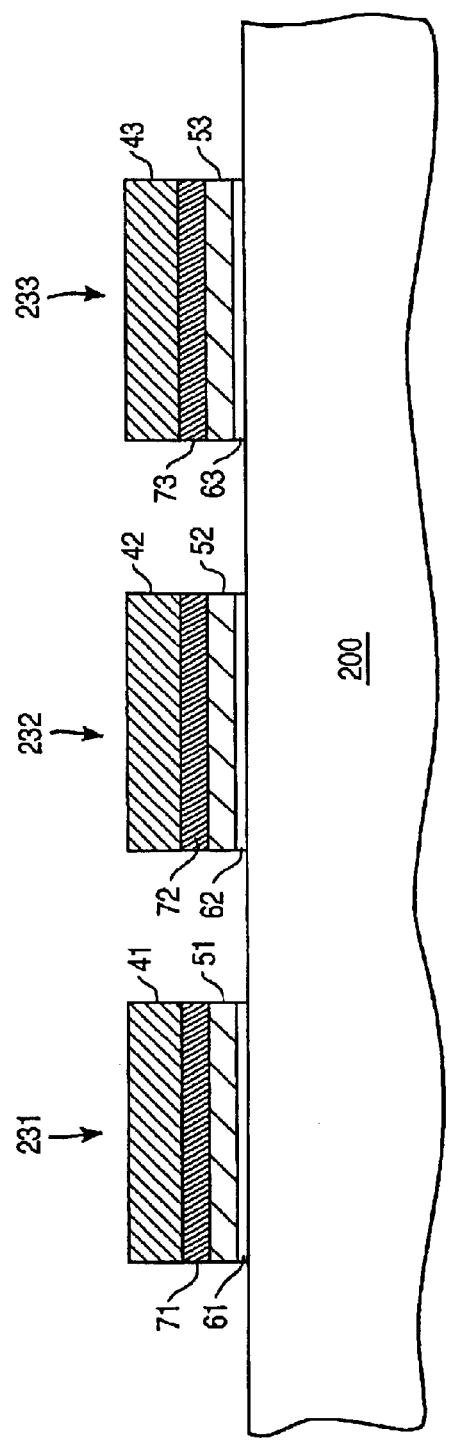
FIG. 2A
FIG. 2B

FLASH MEMORY ARRAY WITH DUAL FUNCTION CONTROL LINES AND ASYMMETRICAL SOURCE AND DRAIN JUNCTIONS

CROSS-REFERENCE TO RELATED APPLICATIONS

This Application is a Divisional Application of, and claims the benefit of the filing date of the following Application: FLASH MEMORY ARRAY WITH DUAL FUNCTION CONTROL LINES AND ASYMMETRICAL SOURCE AND DRAIN JUNCTIONS, by Michael A. Van Buskirk and Chi Chang, filed on Jan. 16, 1998, U.S. Ser. No. 09/008,162, now U.S. Pat. No. 6,492,675; which is incorporated herein by reference.

This Application is related to the following Application: PROCESS FOR FABRICATING A FLASH MEMORY ARRAY WITH DUAL FUNCTION CONTROL LINES, by Michael A. Van Buskirk and Chi Chang, filed on Jan. 16, 1998, Ser. No. 09/008,415, issued as U.S. Pat. No. 6,001,689; which is incorporated herein by reference.

BACKGROUND OF THE INVENTION

1. Field of Invention

The present invention pertains to the field of non-volatile memories. More particularly, this invention relates to a non-volatile memory array that includes self-aligned dual function bit lines and asymmetrical source and drain junctions.

2. Description of the Related Art

Prior non-volatile memories typically include an array of memory cells which are accessible via a matrix of control lines. Such control lines typically include dedicated bit lines that couple to the drain regions of the memory cells. In addition, such control lines usually include word lines that couple to the control gates of the memory cells and dedicated $V_{ss}$ lines that couple to the source regions of the memory cells.

Such dedicated bit lines are typically formed from a metal such as aluminum. Such word lines are commonly formed of a polysilicon material or polycide material that includes a refractory metal. Such prior memory arrays typically include drain contact areas that provide electrical coupling between the drain regions of the memory cells and the dedicated bit lines.

Such drain contact areas are usually defined by the photo lithographic printing equipment employed in the particular memory device manufacturing process. Typically, such printing equipment is characterized by a minimum feature size for forming areas on the memory array including the drain contact areas. As a consequence, each drain contact area consumes a fixed minimum area of integrated circuit die space according to the minimum feature size inherent with the particular printing equipment.

Unfortunately, the integrated circuit die space consumed by such drain contact features limits the density of a memory array for a given area of integrated circuit die space. Such density limitations commonly require that high capacity memory arrays be implemented on larger silicon substrates. Such larger silicon substrates usually increases the overall cost of such memory devices.

One prior method for eliminating such drain contact features in a nonvolatile memory array is to employ an array architecture that may be referred to as a virtual ground architecture. Such a virtual ground array includes dual-function control lines that function as both bit lines and $V_{ss}$ lines. Such a virtual ground array usually obviates the need for forming drain contact features for dedicated bit lines.

The dual function control lines in prior virtual ground memory arrays are typically formed by masking, dopant implant, and thermal diffusion process steps. Such a process that employs masking and thermal diffusion process steps usually causes migration of the implanted dopant into areas outside of the control line areas defined by the mask. Such dopant migration typically requires increased spacing of control lines in order to provide electrical isolation of the control lines from other areas of the memory array. Unfortunately, such increased spacing of control lines usually reduces the density of memory cells formed by such a process.

SUMMARY

The present invention, roughly described, provides for a flash memory formed by a process wherein at least two parallel stacked gate strips are formed on a silicon substrate such that the stacked gate strips are separated by a plurality of field oxide islands. A first junction and a second junction are then formed in each of a set of source/drain regions located between the stacked gate strips and between the field oxide islands. A chemical etch is then applied to form the field oxide islands into pairs of oxide spacers and to expose a continuous strip of the silicon substrate between the oxide spacers and over the source/drain regions. A dopant is implanted into the continuous strip to form a control line to the first and second junctions such that the control line is aligned by the oxide spacers.

One embodiment of the flash memory device includes a plurality of stacked gate islands, one or more source/drain regions between at least a subset of the plurality of stacked gate islands, a first junction in each of the source/drain regions, a second junction in each of the source/drain regions and a dual function control line in the source/drain regions. The first junction and second junction are asymmetrical. Another embodiment of the flash memory device includes a stacked gate structure, a first source/drain region, a first junction in the first source/drain region, a second junction in the first source/drain region, a first dual function control line in the first source/drain region, a second source/drain region, a third junction in the second source/drain region, a fourth junction in the second source/drain region and a second dual function control line in the second source/drain region.

A flash memory of the present invention can be operated by one of many various alternative methods. One embodiment method includes programming a flash memory cell using a first source/drain region as a drain and a second source/drain region as a source; and reading the flash memory cell using the first source/drain region as the source and the second source/drain region as the drain. In another embodiment, the method includes connecting the second dual function control to a ground potential while programming the flash memory, and connecting the first dual function control line to the ground potential while reading the flash memory cell.

In yet another embodiment, the method of operating the flash memory cell includes programming the flash memory cell using the first source/drain region as a drain and the second source/drain region as a source such that the step of programming includes transferring electrons from the floating gate to the drain.

The flash memory is read using the second source/drain region as a drain and the first source/drain region as a source.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings.

FIG. 2A provides a cross-sectional view of the flash memory along section AA.

FIG. 2B provides a cross-sectional view of the flash memory along section BB.

DETAILED DESCRIPTION

Figure 1:
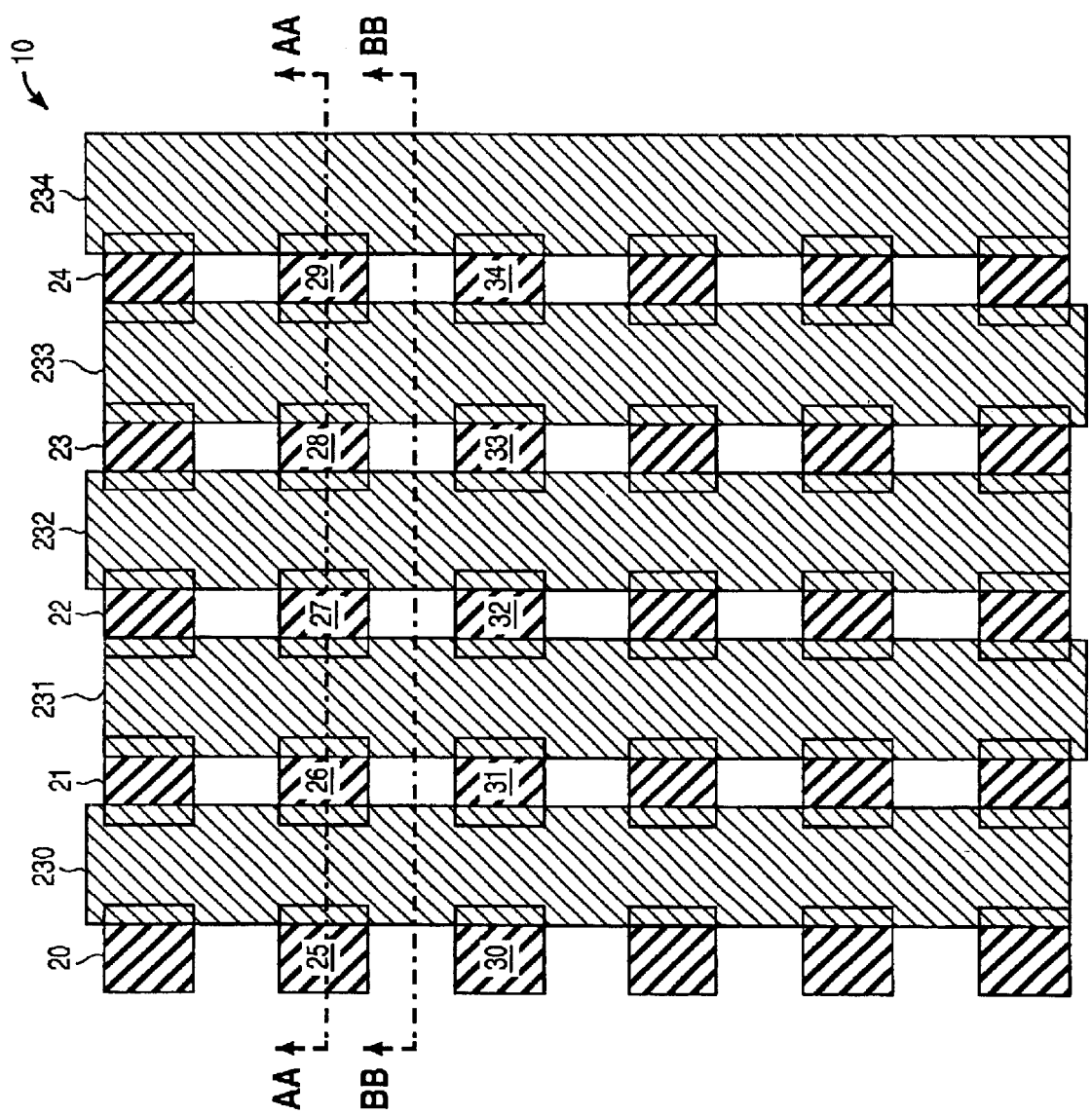
FIG. 1 is a top view of a core area of a flash memory after a series of front end processing steps that form a set of field oxide islands and a set of stacked gate strips.

FIG. 1 is a top view of a core area 10 of a flash memory after a series of front end processing steps. The front end processing steps on the core area 10 form a set of field oxide islands, a subset of which are referenced as field oxide islands 20–34. The field oxide islands 20–34 delineate isolation areas and active areas for flash memory cells in the core area 10. The front end processing steps also form a set of stacked gate strips 230–234 in the core area 10.

FIGS. 2A and 2B provide cross-sectional views along sections AA and BB, respectively. FIG. 2A shows the field oxide islands 26–29 deposited onto a silicon substrate 200 that contains the core area 10. A set of thin oxide layers are deposited on the silicon substrate 200 between the field oxide islands 20–34 including a set of thin oxide layers 61–63 deposited on the silicon substrate 200 between the field oxide islands 26–27, 27–28, and 28–29.

Each stacked gate strip 230–234 includes a pair of polysilicon layers separated by a dielectric region. For example, the stacked gate strip 231 includes a polysilicon layer 41 and a polysilicon layer 51 separated by a dielectric region 71. The polysilicon layer 41 is formed into a control gate for a flash memory cell in core area 10. Polysilicon layer 51 is formed into a floating gate for the same flash memory cell in core area 10. Similarly, the polysilicon layers 42 and 52 and the polysilicon layers 43 and 53 provide two more flash memory cells in the core area 10.

The stacked gate strips 230–234 are initially formed by a deposition of a first sheet of polysilicon onto the field oxide islands and the thin oxide layers in the core area 10. The first sheet of polysilicon provides material for the floating gates 51–53. In one embodiment, the first sheet of polysilicon is deposited according to a chemical vapor deposition process step. Alternatively, the first sheet of polysilicon may be substituted with a layer of amorphous silicon.

In one embodiment, the dielectric regions 71–73 include a set of oxide-nitride-oxide layers which are deposited onto the first sheet of polysilicon. An initial oxide layer is formed by a chemical vapor deposition process step. Thereafter a layer of nitride is deposited onto the initial oxide layer. Finally, a top oxide layer is grown or deposited onto the nitride layer to form an oxide-nitride-oxide structure for the dielectric regions 71–73.

The formation of the stacked gate strips 230–234 continues with a deposition of a second sheet of polysilicon onto the oxide-nitride-oxide layers. The second sheet of polysilicon provides material for the control gates 41–43. Alternatively, the second sheet of polysilicon may be substituted with a layer of amorphous silicon.

The layers in the core area 10 that include the first and second sheets of polysilicon separated by the oxide-nitride-oxide dielectric region are then masked and etched into long strips to form the stacked gate strips 230–234.

Figure 3:
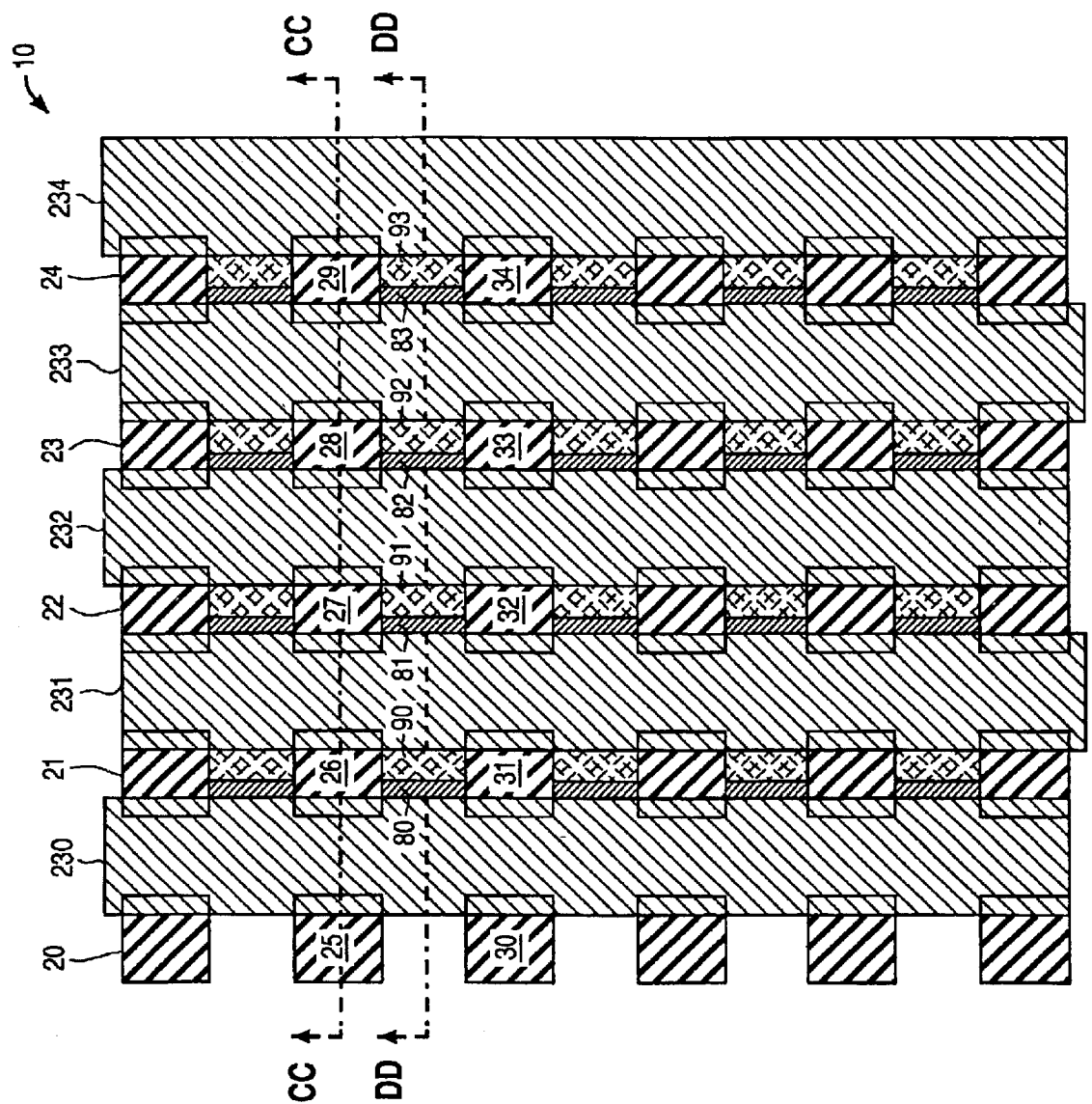
FIG. 3 is a top view of the core area which shows doped regions for source/drain functions formed in the silicon substrate between the field oxide islands.

FIG. 3 is a top view of the core area 10 which shows doped regions formed in the silicon substrate 200 between the field oxide islands 20–34. The doped regions includes strips of $n^+$ doped regions and overlapping strips of $n^-$ doped regions formed between adjacent pairs of field oxide islands 20–34 in a direction parallel to the stacked gate strips 230–234. For example, a set of $n^+$ doped regions 80–83 are formed between field oxide island pairs 26 and 31, 27 and 32, 28 and 33, and 29 and 34, respectively. A set of $n^-$ doped regions 90–93 are formed adjacent to and overlapping the $n^+$ doped regions 80–83. The $n^+$ and $n^-$ doped regions provide asymmetrical source/drain junctions.

Figure 4:
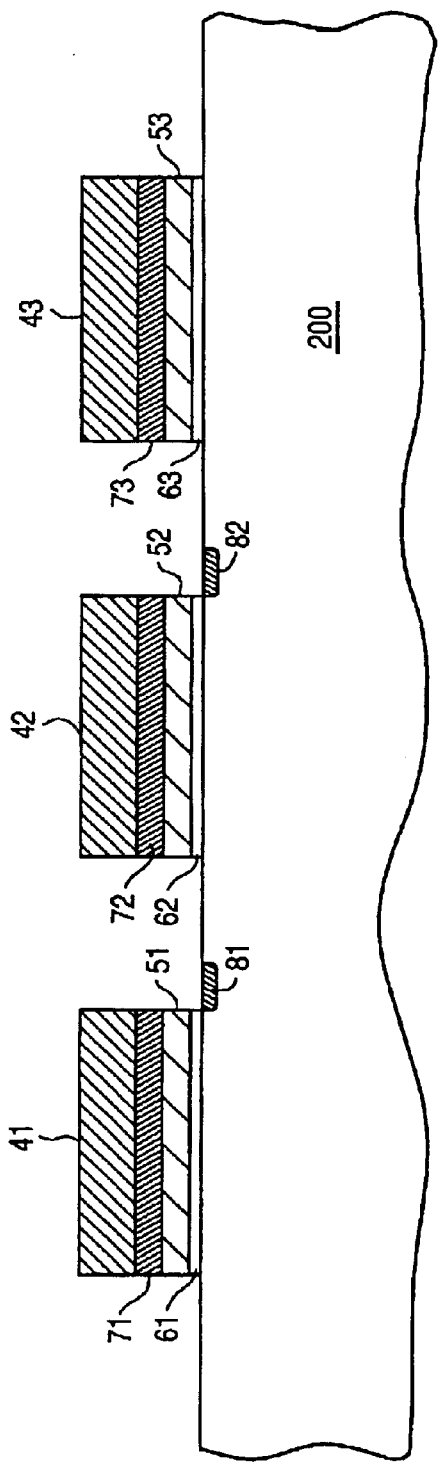
FIG. 4 is a view along the cross-section DD which illustrates the formation of the $n^+$ doped regions.

FIG. 4 is a view of the core area 10 along the cross-section DD which illustrates the formation of the $n^{30}$ doped regions 81 and 82. Initially, the $n^+$ doped regions 81 and 82 are defined by a masking step applied to the core area 10. The masking step defines long strips located between the stacked gate strips 230–234 and delineate the $n^+$ doped regions including $n^+$ doped regions 81 and 82. After the masking step, an $n^+$ type dopant is implanted into the silicon substrate 200 into the unmasked regions including the regions 81 and 82. The implant mask is then removed to expose the entire area between the stacked gate strips 230–234 including the n⁺ doped regions 81–82.

Figure 5:
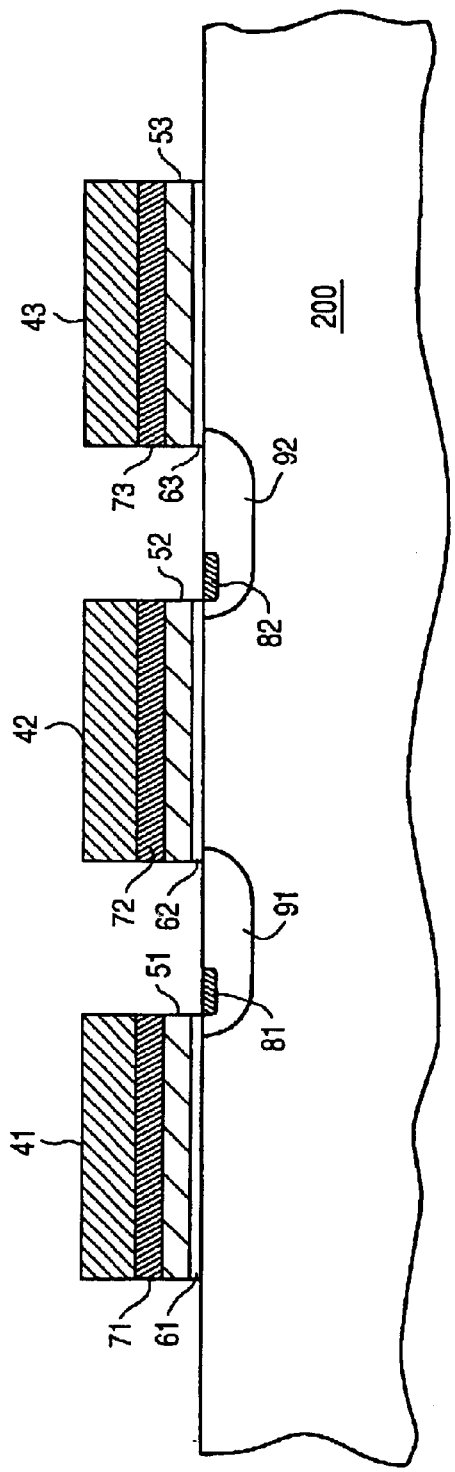
FIG. 5 is a view along the cross-section DD which illustrates the formation of the n doped regions.

FIG. 5 is a view of the core area 10 along the cross-section DD which illustrates the formation of the n⁻ doped regions 91 and 92. The removal of n+ mask exposes the areas of the silicon substrate 200 between the stacked gate strips 230–234. An n⁻ dopant is implanted into the areas 91 and 92 as well as the areas 81 and 82.

After formation of the n⁺ and n⁻ doped regions between the stacked gate strips 230–234, a spacer oxide layer 210 is deposited over the core area 10. In one embodiment the spacer oxide layer is formed by a chemical vapor deposition step. The spacer oxide layer 210 then undergoes a first chemical etching step.

Figure 6A:
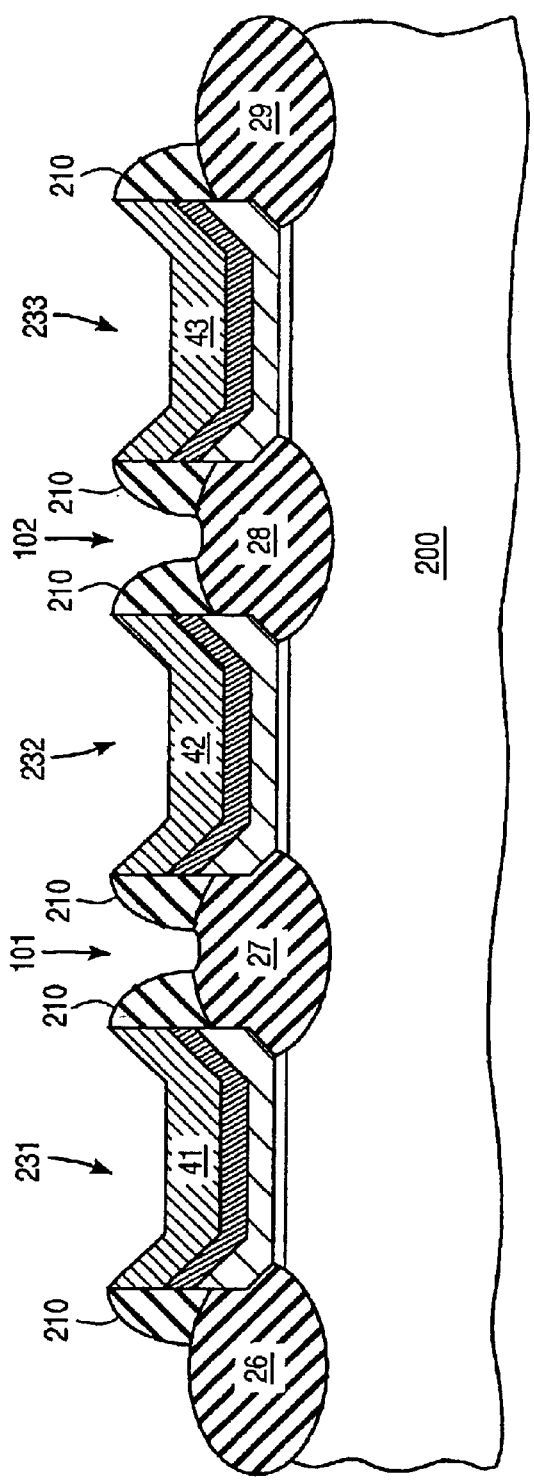
FIG. 6A is a view along cross-section CC of the core area after the first chemical etching step on the spacer oxide layer.

FIG. 6A is a view along cross-section CC of the core area 10 after the first chemical etching step on the spacer oxide layer 210. The first chemical etch of the spacer oxide layer forms spacer regions between the stacked gate strips 230–234. For example, a gap 101 is formed between the stacked gate strips 231 and 232 and a gap 102 is formed between the stacked gate strips 232 and 233. As shown, the first chemical etch of the spacer oxide layer causes partial removal of the field oxide islands as shown by the field oxide islands 27 and 28.

Figure 6B:
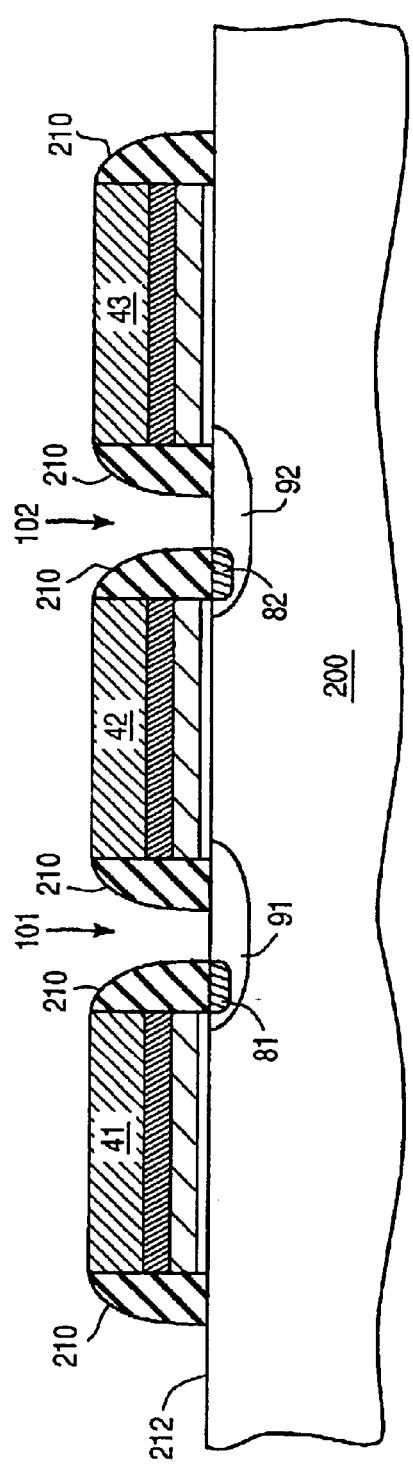
FIG. 6B shows a view along cross-section DD of the core area after the first chemical etching step on the spacer oxide layer.

FIG. 6B shows a view along cross-section DD of the core area 10 after the first chemical etching step on the spacer oxide layer 210. The first chemical etch causes removal of part of spacer oxide layer 210 down to a surface 212 of the silicon substrate 200. The first chemical etch is highly selective toward removing oxide rather than silicon.

Thereafter a second chemical etch is applied to the core area 10 which removes the remainder of the field oxide islands 20–34 not covered by spacer oxide layer 210, down to the surface 212 of the silicon substrate 200. The first and second oxide etching steps applied to the spacer oxide layer 210 are highly preferential to etch oxide and not silicon.

A set of continuous n⁺ strips are then formed by implantation of an n⁺ dopant into the silicon substrate 200. The continuous n⁺ strips are aligned by the oxide spacers between the stacked gate strips 230–234. Each continuous n⁺ strip provides a dual function control line that functions as both a bit line and a $V_{ss}$ line for flash memory cells in the core area 10.

Figure 7A:
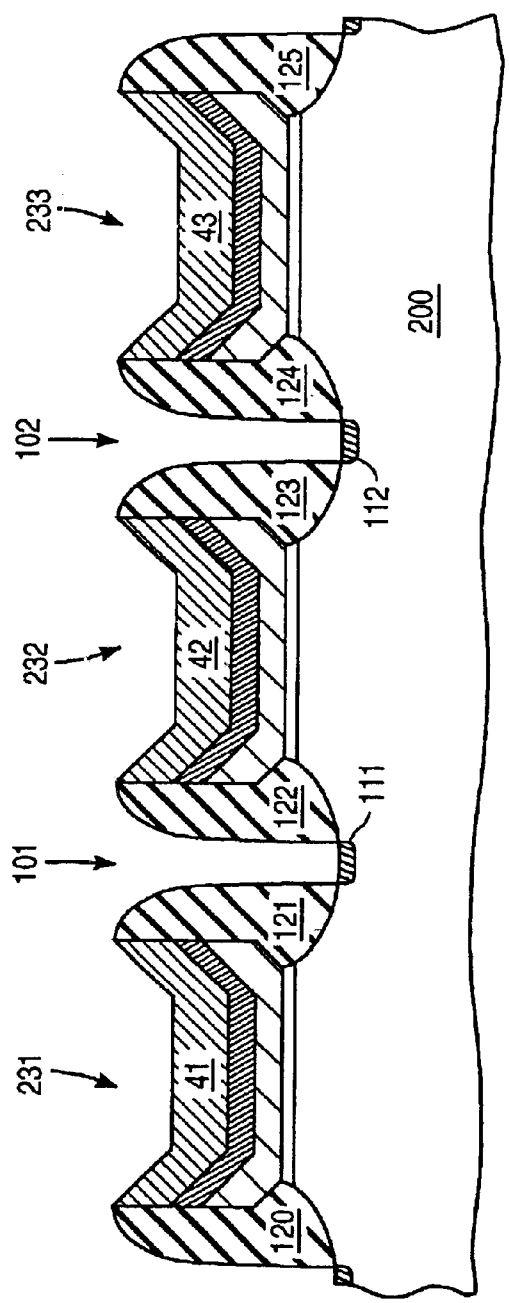
FIG. 7A provides a view along cross-section CC after formation of the continuous $n^+$ strips for the dual-function control lines.
Figure 7B:
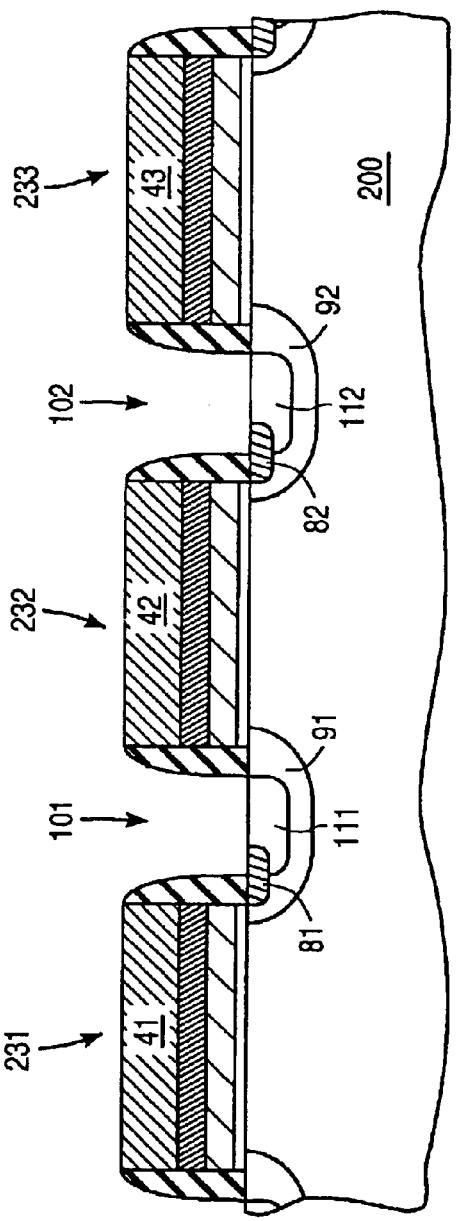
FIG. 7B provides a view along cross-section DD after formation of the continuous $n^+$ strips for the dual-function control lines.

FIGS. 7A and 7B provide views along cross-sections CC and DD, respectively, after formation of the continuous n⁺ strips including the n⁺ strips 111 and 112. The first and second oxide spacer chemical etches remove the spacer oxide layer 210 from surfaces of the stacked gate strips 230–234 and down to the silicon substrate 200 in between the stacked gate strips 230–234. The remnants of the spacer oxide layer 210 and the field oxide island 27 yields oxide spacers 121 and 122. The oxide spacers 121 and 122 control the alignment of the n⁺ strip 111. The oxide spacers 121 and 122 insure proper electrical isolation between the n⁺ strip 111 and an adjacent flash memory cells formed from the stacked gate strips 231 and 232. FIG. 7B shows n⁺ strip 111 in relation to regions 81 and 91.

Figure 8:
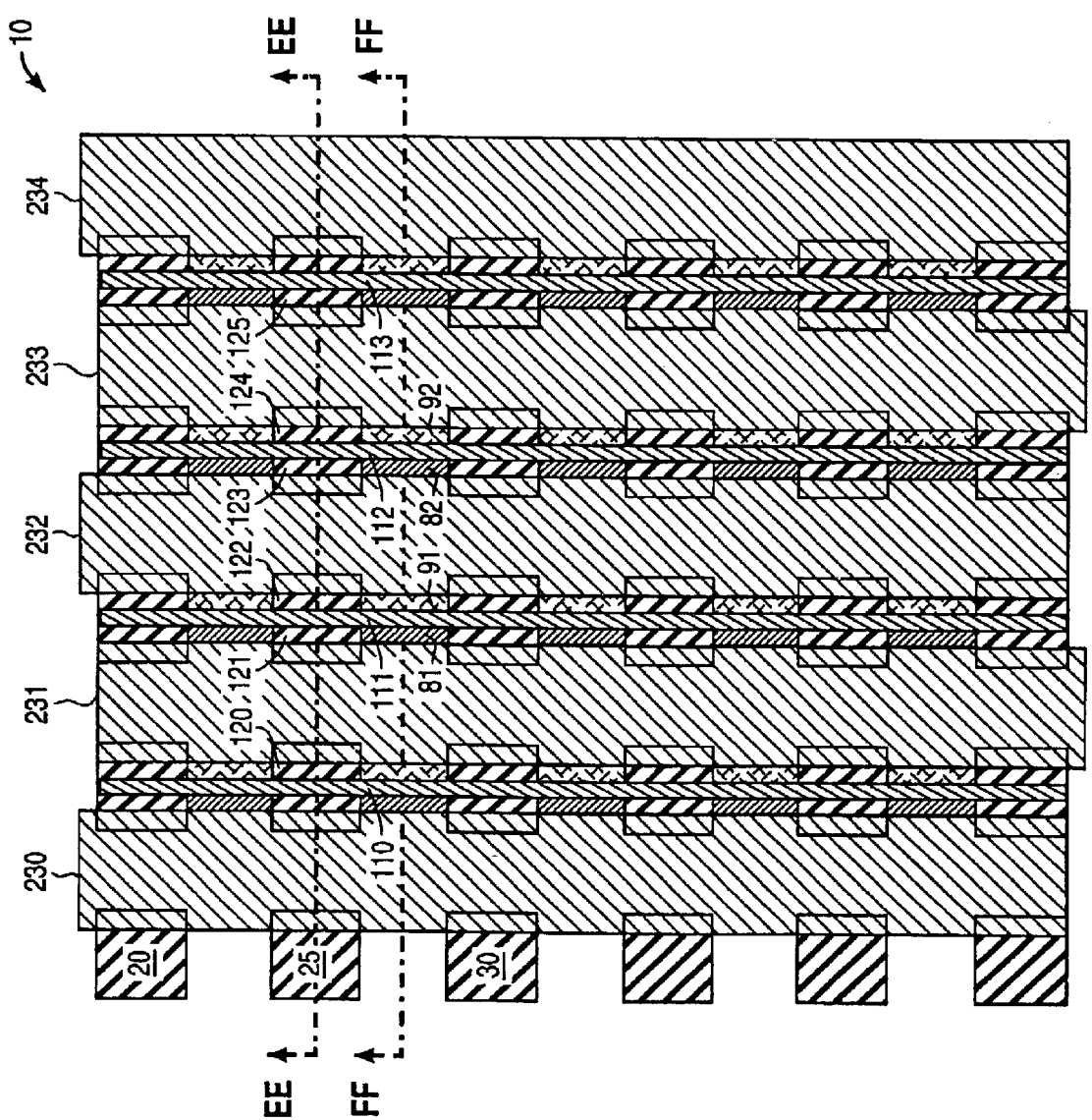
FIG. 8 is a top view of a core area which shows a set of continuous $n^+$ strips of dual function control lines formed between the etched oxide spacers.

FIG. 8 is a top view of a core area 10 which shows a set of continuous n⁺ strips 110–113 formed between the oxide spacers. The continuous n⁺ strips 110–113 provide electrical paths to the asymmetrical source and drain junctions of the flash memory cells of the core area 10. The n⁺ strips function as bit and $V_{ss}$ lines. The n⁺ strips that function as bit lines during read operations on the flash memory cells in the core area 10 also function as $V_{ss}$ lines during programming operations on the flash memory cells in the core area 10. The n⁺ strips that function as $V_{ss}$ lines during read operations on the flash memory cells in the core area 10 also function as bit lines during programming operations on the flash memory cells in the core area 10.

Figure 9A:
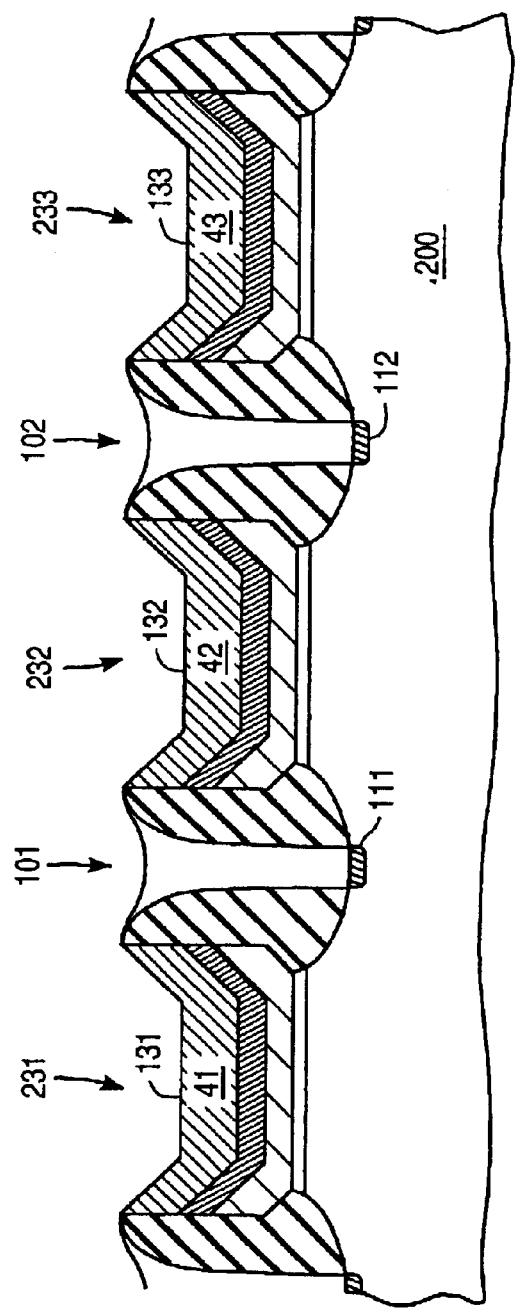
FIG. 9A provides a view along cross-section EE after the chemical etch that planarizes the surface of the core area.
Figure 9B:
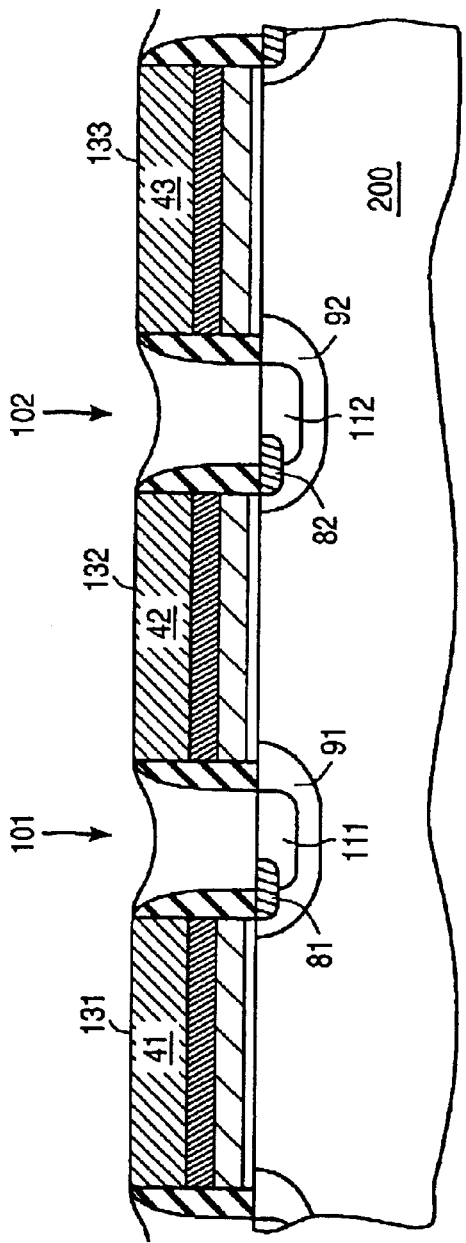
FIG. 9B provides a view along cross-section FF after the chemical etch that planarizes the surface of the core area.

The core area 10 is then planarized prior to word line formation. Initially, an oxide layer is deposited over the core area 10 with a chemical vapor deposition process step. The oxide layer undergoes an etch back step which planarizes the core area 10 and facilitates formation of word lines for the flash memory cells. FIGS. 9A and 9B provide views along cross-sections EE and FF, respectively, after the chemical etch that planarizes the surface of the core area 10. The planarization oxide layer fills in the oxide spacers 101 and 102 and the subsequent chemical etch exposes the surfaces 131–133 of the stacked gate strips 231–233.

A salicidation process is then performed on the core area 10 to bridge the stacked gate strips 230–234 and provide word line interconnect. The word line interconnect in one embodiment includes a titanium silicide layer and a layer of amorphous silicon deposited onto the surfaces 131–133. The word line interconnect is then masked and chemically etched to form local interconnect word lines in the core area 10. The local interconnect wordlines are perpendicular to the direction of the original stacked gate strips 230–234. The etching step also removes remaining areas of the stacked gate strips 230–234 outside the word line interconnect areas.

Figure 10:
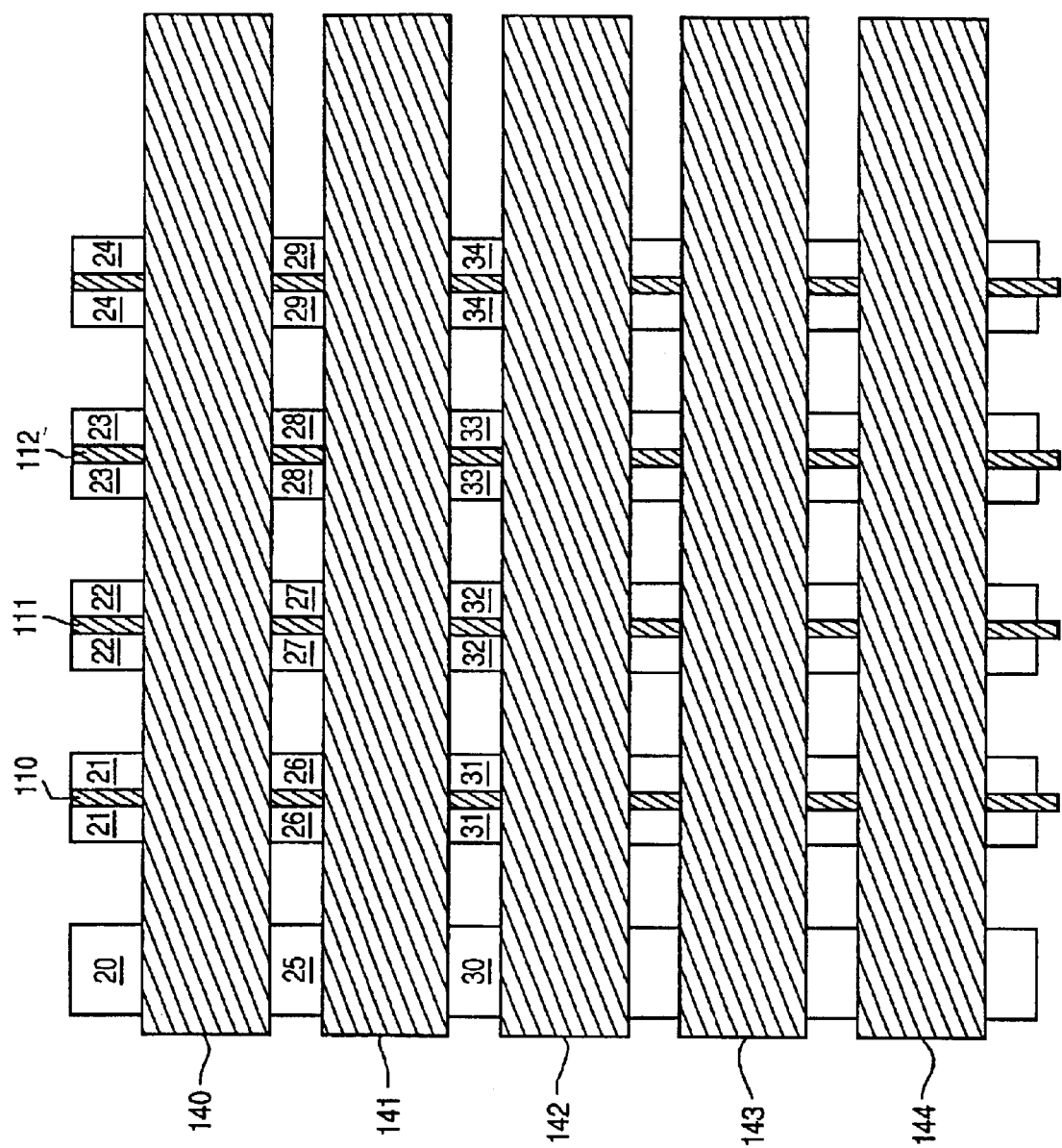
FIG. 10 is a top view of the core area which shows the local interconnect word lines.

FIG. 10 is a top view of the core area 10 which shows the local interconnect word lines 140–144. The portions of the stacked gate strips 230–234 outside the word lines 140–144 are etched away to reveal remaining portions of field oxide islands 20–34 along with the dual function continuous n⁺ strips which are aligned by the oxide spacer provided by the remnants of the field oxide islands 20–34.

Figure 11:
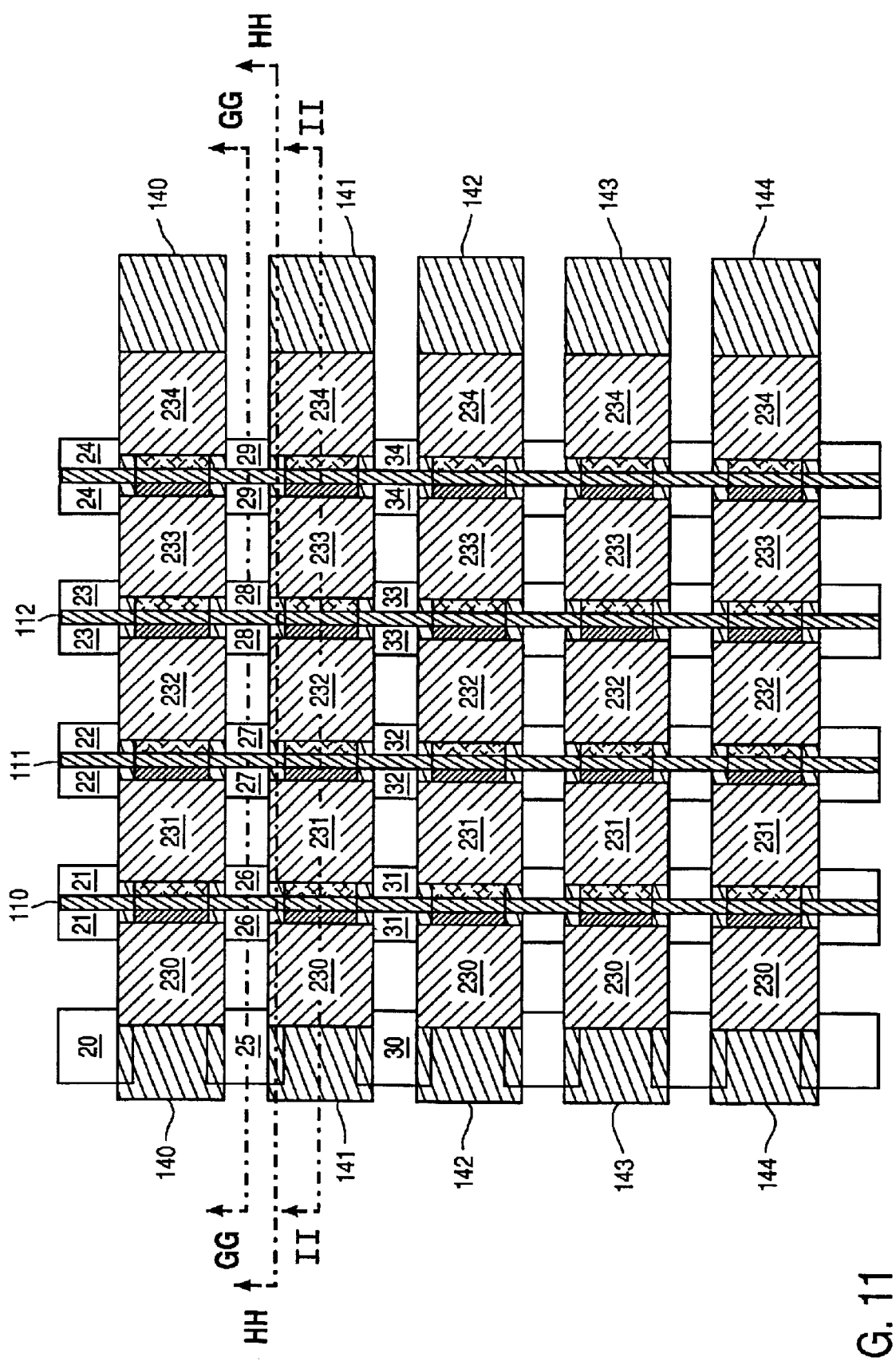
FIG. 11 is a top view of the core area including cutaway portions which reveal the remaining active regions of the stacked gate strips and hidden asymmetrical source/drain junctions.

FIG. 11 is a top view of the core area 10 including cutaway portions which reveal the remaining active areas (or islands) of the stacked gate strips 230–234 as well as hidden doped regions for source and drain junctions.

Figures 12A, 12B, 12C:
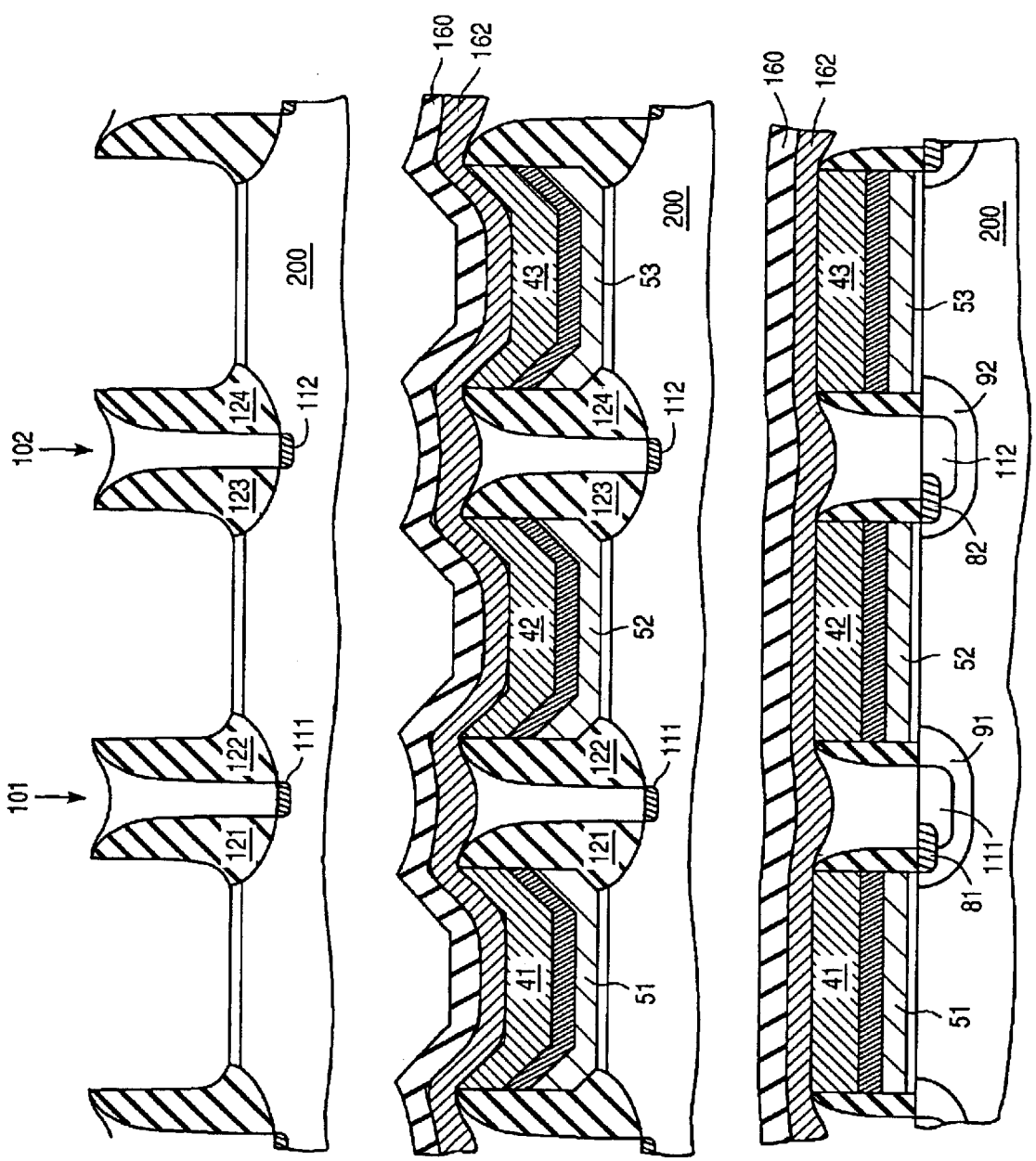
FIG. 12A provides a view along cross-section GG of a set of memory cells in the core area.
FIG. 12B provides a view along cross-section HH of a set of memory cells in the core area.
FIG. 12C provides a view along cross-section II of a set of memory cells in the core area FIG. 13 provides a cross-sectional view of memory cells implementing an alternative program/erase/read scheme.

FIG. 12A provides a view along cross-section GG of the core area. The remaining oxide regions including the oxide spacers 120–124 along with the planarization oxide in the spacers 101 and 102 provide electrical isolation for the continuous n⁺ strips 111 and 112.

FIGS. 12B and 12C are views along cross-sections HH and II of the core area, respectively. The cross-sectional views show a titanium layer 162 and an amorphous silicon layer 160 deposited thereon. The titanium layer 162 and the amorphous silicon layer 160 together form a word line interconnect among the control gates 40–43. Approximately 350 Angstroms thick of titanium is either 'sputtered' or 'CVD-deposited' onto the wafer surface, followed by an approximately 750 Angstroms thick of amorphous silicon deposition by sputtering. Then, heat treatment is applied (typically, by using RTA, or rapid thermal annealing, process) to react the titanium and amorphous silicon to form titanium silicide. An alternative method of forming this local interconnect includes using a low-temperature CVD WSix (tungsten silicide) deposition of a thickness of about 1500 Angstroms. There are other more 'exotic' methods, such as using tungsten (W) metal scheme, that can also achieve the same purpose.

An integrated circuit using the flash memory core described above will also have periphery transistors that are used to implement other logic and functions. These periphery transistors will not have stacked gates. The periphery transistors will get the "silicided" gates (a titanium layer and an amorphous silicon layer) like the core array cells. Unlike mainstream microprocessor technology, these periphery transistors' source and drain silicon surfaces will not be "salicided" with this scheme. As a result, these periphery transistors' n+ or p+junctions can withstand relatively high voltages, are less leaky and have higher junction breakdown voltages as compared to the salicided junctions. If the Ti/amorphous silicon (to form titanium silicide local interconnect and gates) scheme is used, it is much easier to fabricate the p+doped polysilicon gate p-channel transistors, without as much concern of boron impurity penetration into gate oxide/transistor channel as otherwise would if the WSix gate is used and with a reaction gas using WF6. A major disadvantage of p+ doped gate p-channel transistor is better "off-state" or "turn-off" characteristics.

The basic functions of the flash memory cells in the core area 10 are described using an example flash memory cell that includes a control gate from the polysilicon layer 42 and a floating gate from the polysilicon layer 52. The n⁻ doped region 91 and the n⁺ doped region 81 provide asymmetrical source and drain junctions for the flash memory cell. The n⁻ doped region 91 is a source junction during programming and is a drain junction during reading. The n⁺ doped regions 81 is a drain junction during programming and is a source junction during reading.

During program operations using source side injection, the dual function n⁺ strip 111 provides a source path to the flash memory cell while the dual function n⁺ strip 112 provides a drain path to the same flash memory cell. The n⁻ doped region 91 yields a relatively high resistive path on the source side of the flash memory cell during programming. The resistivity of the n⁻ doped region 91 heats or energizes electrons that travel between the source and the drain through the channel of the flash memory cell. Some electrons attain sufficient energy near the n⁻ doped region 91 to travel across the oxide layer 62 to the floating gate 52.

This phenomenon of electron injection to the floating gate 52 near the source side of a flash memory cell is referred to as source side injection. Source side injection reduces power consumption during programming because a higher rate of electron injection to the floating gate occurs in comparison to the drain side injection which characterizes flash memory cells having symmetrical source and drain junctions.

To achieve the source side injection during programming the source path is connected to ground, the drain path is connected to medium positive voltage and the control gate is connected to a high positive voltage. A medium positive voltage can be between approximately three and approximately eight volts. A high positive voltage can be between approximately six and approximately twelve volts. Looking at FIG. 12, for example, strip 111 can be connected to ground (or ground potential), strip 112 can be connected to five volts, and gate 42 can be connected to positive eight volts for program operation.

For erase operations, strip 111 is connected to a low positive voltage. The low positive voltage can be between a voltage slightly above zero and three volts. Strip 112 is connected to a medium positive voltage or Vcc. Gate 42 is connected a negative high voltage.

During read operations, n⁺ strip 111 functions as a drain path while the n⁺ strip 112 functions as a source path. This reversal of the source and the drain junctions prevents the high resistivity of the n⁻ doped region 91 from hindering the available levels of read current in the flash memory cell. To perform a read, strip 111 is connected to a low positive voltage, strip 112 is connected to ground and gate 42 is connected to Vcc.

Figure 13:
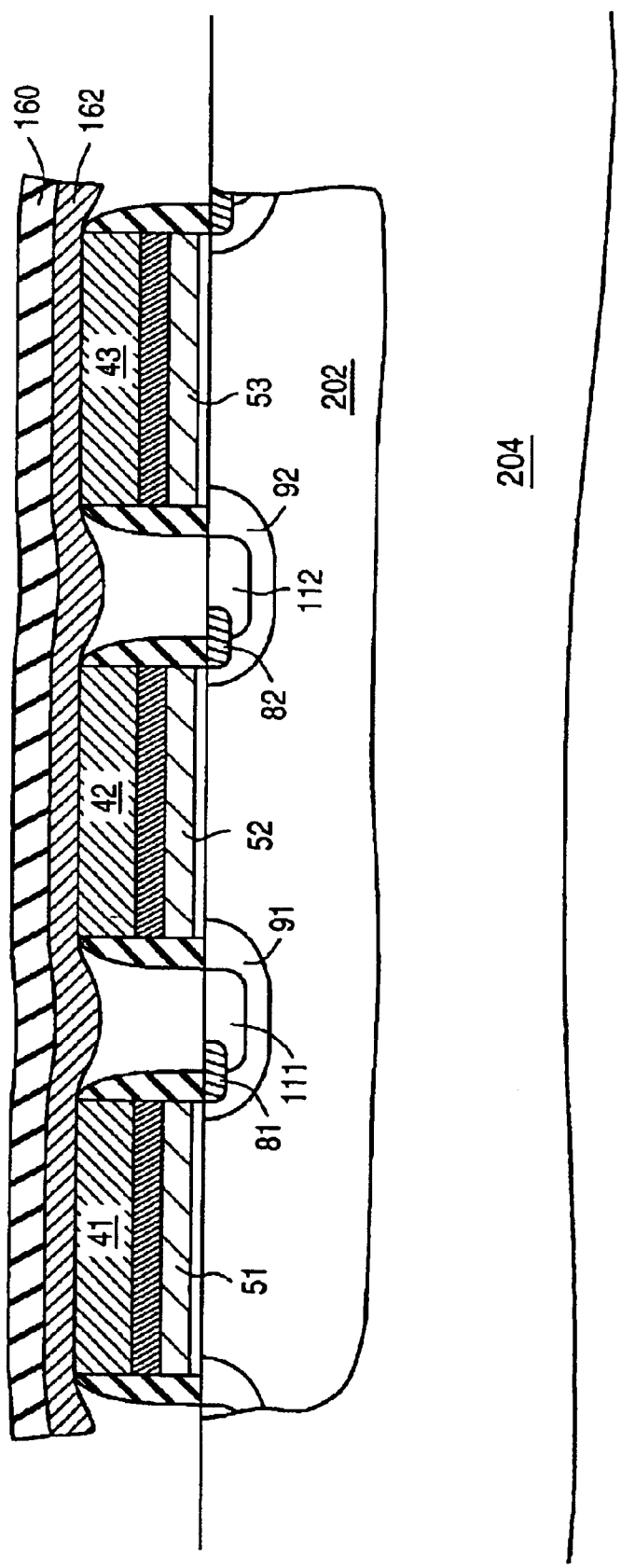

Instead of using the source side injection as described above, the present invention flash memory can be operated using a DINOR process. A description of the DINOR (Divided bit line NOR) structure and process can be found in "A Novel Cell Structure Suitable For A 3 Volt Operation, Sector Erase Flash Memory," H. Onoda, Y. Kunori, S. Kobayashi, M. Ohi, A. Fukumoto, N. Ajika and H. Miyoshi, LSI Laboratory, Mitsubishi Electric Corporation, 1992, IEEE 600-IEDM 92; and "Memory Array Architecture and Decoding Scheme for 3 V Only Sector Erasable DINOR Flash Memory" Shin-Ichi Kobayashi, Hiroaki Nakai, Yuichi Kunori, Takeshi Nakayama, Yoshikazu Miyawaki, Yasushi Terada, Hiroshi Onada, Natsuo Ajika, Masahiro Hatanaka, Hirokazu Miyoshi, and Tsutomu Yoshihara, 1994 IEEE, Journal of Solid State Circuits Vol. 29, No. 4, April 1994; both incorporated by reference. This alternative process will be described with respect to FIG. 13. Note that the stacked gate islands, junctions and dual control lines of FIG. 13 are the same as described with respect to FIG. 12C. However, FIG. 13 further depicts a p-well 202 inside a n-well 204.

During a program operation using a DINOR process, strip 111 acting as a source path, is connected to a low positive voltage (e.g., 1 volt). Strip 112, acting as a drain path, is connected to a medium positive voltage (e.g., 5 volts). Additionally, gate 41 is connected to a high negative voltage (between −7 and −10 volts), p-well 202 is grounded and n-well 204 is grounded. In the DINOR process, electrons from floating gate 52 are transferred to the drain. Note that during a programming operation, a neighboring flash memory cell can be inhibited so that it will not be programmed inadvertently. That is, the n⁻ junction carries a large voltage drop from the applied bit line such that the electric field across the tunnel oxide at the neighbor memory cell is smaller than the intended cell and the electrons stored on the floating gate of the neighbor cell will not be discharged. Note that in FIG. 13, the memory cell with gate 43 is a neighbor to the memory cell with gate 42.

During an erase operation, strip 111 is connected to ground of left floating, strip 112 is connected to ground of left floating, control gate 42 is connected to a high positive voltage (e.g., between 7 and 10 volts), p-well 202 is connected to a negative high voltage preferably between negative eight to negative ten volts and n-well 204 is grounded.

During read operations, strip 111 functions as a drain while strip 112 functions as a source. Strip 111 is connected to a low voltage, strip 112 is grounded, gate 41 is connected to Vcc, p-well 202 is grounded and n-well 204 is grounded.

The foregoing detailed description of the invention has been presented for purpose of illustration and description. It is not intended to be exhaustive or to limit the invention to the precise form disclosed, and obviously many modifications and variations are possible in light of the above teaching. The described embodiment was chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method of operating a flash memory cell having a control gate, the flash memory cell having a first dual function control line in a first source/drain region and a second dual function control line in a second source/drain region, comprising the steps of:

programming the flash memory cell using the first source/drain region as a drain and the second source/drain region as a source; and reading the flash memory cell using the second source/drain region as a drain and the first source/drain region as a source;

wherein the step of programming includes providing a voltage having a magnitude of less than ten volts to the control gate.

2. A method according to claim 1, wherein the step of programming includes:

providing a high positive voltage to the control gate;

providing a medium positive voltage to the drain; and providing a ground potential to the source.

3. A method according to claim 2, wherein the high positive voltage is approximately eight volts and the medium positive voltage is approximately five volts.

4. A method according to claim 1, wherein the step of programming includes:

providing a high negative voltage to the control gate;

providing a medium positive voltage to the drain; and providing a low voltage to the source.

5. A method according to claim 1, wherein the step of reading includes:

providing a medium positive voltage to the control gate;

providing a low positive voltage to the drain; and providing a ground potential to the source.

6. A method according to claim 5, wherein the low positive voltage is approximately one volt and the medium positive voltage is approximately five volts.

7. A method according to claim 1, wherein the second dual function control line is connected to a ground potential during the step of programming and the first dual function control line is connected to a ground potential during the step of reading.

8. A method of operating a flash memory cell having a control gate, the flash memory cell having a first dual function control line in a first source/drain region and a second dual function control line in a second source/drain region, comprising the steps of:

connecting the second dual function control line to a ground potential and programming the flash memory cell; and connecting the first dual function control line to the ground potential and reading the flash memory cell;

wherein the step of programming includes providing a voltage having a magnitude of less than ten volts to the control gate.

9. A method according to claim 8, wherein the step of programming includes:

providing a high positive voltage to the control gate;

providing a medium positive voltage to the drain; and providing a ground potential to the source.

10. The method according to claim 8, wherein the step of reading includes:

providing a medium positive voltage to the control gate;

providing a low positive voltage to the drain; and providing a ground potential to the source.

11. A method of operating a flash memory cell, the flash memory cell having a control gate, a floating gate, a channel, a first dual function control line in a first source/drain region, a second dual function control line in a second source/drain region, a n-well and a p-well inside the n-well, comprising the steps of:

programming the flash memory cell using the first source/drain region as a drain and the second source/drain region as a source, the step of programming includes transferring electrons from the floating gate to the drain; and reading the flash memory cell using the second source/drain region as a drain and the first source/drain region as a source;

wherein the step of programming includes providing a voltage having a magnitude of less than ten volts to the control gate.

12. The method according to claim 11, wherein:

the step of programming the flash memory cell is performed without programming a neighboring flash memory cell.

13. A method according to claim 11, further comprising the step of:

erasing the flash memory cell, including providing a high positive voltage to the control gate, providing a medium positive voltage to the drain, and providing a ground potential to the source.

14. A method according to claim 11, wherein the step of programming includes:

providing a high negative voltage to the control gate;

providing a medium positive voltage to the drain; and providing a low voltage to the source.

15. A method according to claim 11, wherein the second dual function control line is connected to a ground potential during the step of erasing and the first dual function control line is connected to a ground potential during the step of reading.

* * * * *